US010754000B2

(12) United States Patent
Guisan et al.

(10) Patent No.: US 10,754,000 B2
(45) Date of Patent: Aug. 25, 2020

(54) MULTI-PROBE FERROMAGNETIC RESONANCE (FMR) APPARATUS FOR WAFER LEVEL CHARACTERIZATION OF MAGNETIC FILMS

(71) Applicant: Taiwan Semiconductor Manufacturing Company, Ltd., Hsinchu (TW)

(72) Inventors: Santiago Serrano Guisan, San Jose, CA (US); Luc Thomas, San Jose, CA (US); Son Le, Gilroy, CA (US); Guenole Jan, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 73 days.

(21) Appl. No.: 16/056,783

(22) Filed: Aug. 7, 2018

(65) Prior Publication Data
US 2020/0049787 A1    Feb. 13, 2020

(51) Int. Cl.
  *G01R 33/60*  (2006.01)
  *G01R 33/24*  (2006.01)
  *G01R 33/345* (2006.01)
(52) U.S. Cl.
  CPC ............. *G01R 33/60* (2013.01); *G01R 33/24* (2013.01); *G01R 33/345* (2013.01)
(58) Field of Classification Search
  CPC ...... G01R 33/24; G01R 33/60; G01R 33/345; G01R 31/318511; G01N 24/00; G01N 24/10

(Continued)

(56) References Cited

U.S. PATENT DOCUMENTS 4,286,216 A * 8/1981 Auld ...................... G01N 22/02
                                                                324/235
4,364,012 A * 12/1982 Auld .................. G01N 27/9053
                                                                324/237

(Continued)

OTHER PUBLICATIONS

"Vector network analyzer ferromagnetic resonance of thin films on coplanar waveguides: Comparison of different evaluation methods," by C. Bilzer et al., AIP Journal of Applied Physics 101, 074505 (2007); Apr. 12, 2007, American Institute of Physics, http://dx.doi.org/10.1063/1.2716995, 5 pgs.

(Continued)

*Primary Examiner* — Patrick Assouad
*Assistant Examiner* — Demetrius R Pretlow
(74) *Attorney, Agent, or Firm* — Haynes and Boone, LLP

(57) ABSTRACT

A ferromagnetic resonance (FMR) measurement system is disclosed with a plurality of "m" RF probes and one or more magnetic assemblies to enable a perpendicular-to-plane or in-plane magnetic field ($H_{ap}$) to be applied simultaneously with a sequence of microwave frequencies ($f_R$) at a plurality of "m" test locations on a magnetic film formed on a whole wafer under test (WUT). A FMR condition occurs in the magnetic film (stack of unpatterned layers or patterned structure) for each pair of ($H_{ap}$, $f_R$) values. RF input signals are distributed to the RF probes using RF power distribution or routing devices. RF output signals are transmitted through or reflected from the magnetic film to a plurality of "n" RF diodes where $1 \leq n \leq m$, and converted to voltage signals which a controller uses to determine effective anisotropy field, linewidth, damping coefficient, and/or inhomogeneous broadening at the predetermined test locations.

68 Claims, 9 Drawing Sheets

(58) Field of Classification Search
USPC .......................................................... 324/309
See application file for complete search history.

(56) References Cited

U.S. PATENT DOCUMENTS

| | | | |
|---|---|---|---|
| 4,528,506 A * | 7/1985 | Davis ..................... | G01R 33/12 324/225 |
| 5,041,782 A | 8/1991 | Marzan | |
| 5,889,402 A * | 3/1999 | Kumatoriya ......... | G01R 33/345 324/316 |
| 6,376,836 B1 * | 4/2002 | Anlage ................. | G01Q 30/06 250/234 |
| 6,501,971 B1 * | 12/2002 | Wolf ....................... | H01P 1/218 333/204 |
| 7,417,442 B2 | 8/2008 | Hachisuka et al. | |
| 7,545,139 B2 | 6/2009 | Saruki et al. | |
| 8,102,174 B2 | 1/2012 | Worledge et al. | |
| 8,264,693 B2 | 9/2012 | Stoica et al. | |
| 8,959,980 B2 | 2/2015 | Vodnick et al. | |
| 9,030,216 B2 | 5/2015 | Lamson et al. | |
| 9,846,134 B2 | 12/2017 | Yang et al. | |
| 2004/0100278 A1 * | 5/2004 | Haycock ................ | G01R 33/60 324/637 |
| 2004/0196037 A1 * | 10/2004 | Xiang .................... | G01N 24/00 324/300 |
| 2009/0212769 A1 | 8/2009 | Stoica et al. | |
| 2010/0023294 A1 | 1/2010 | Fan et al. | |
| 2011/0080241 A1 * | 4/2011 | Kou ........................ | B82Y 25/00 335/284 |
| 2012/0326712 A1 | 12/2012 | Tudosa et al. | |
| 2014/0070800 A1 | 3/2014 | Cho et al. | |
| 2014/0097841 A1 | 4/2014 | Yang et al. | |
| 2016/0372212 A1 | 12/2016 | Kishi | |
| 2019/0049514 A1 * | 2/2019 | O'Brien .............. | G01R 33/098 |

OTHER PUBLICATIONS

"Open-Circuit One-Port Network Analyzer Ferromagnetic Resonance," by C. Bilzer et al., IEEE Transactions on Magnetics, vol. 44, No. 11, Nov. 2008, pp. 3265-3268.

"Microwave susceptibility of thin ferromagnetic films: metrology and insight into magnetization dynamics," by Claus Bilzer, Jan. 8, 2008, Universite Paris Sud—Paris XI, 2007, Chapter 2.1.1, 2.1.2, 12pgs.

"An N-Way Hybrid Power Divider," by Ernest J. Wilkinson, IRE Transactions on Microwave Theory and Techniques, vol. 8, Issue: 1, Jan. 1960, pp. 116-118.

* cited by examiner

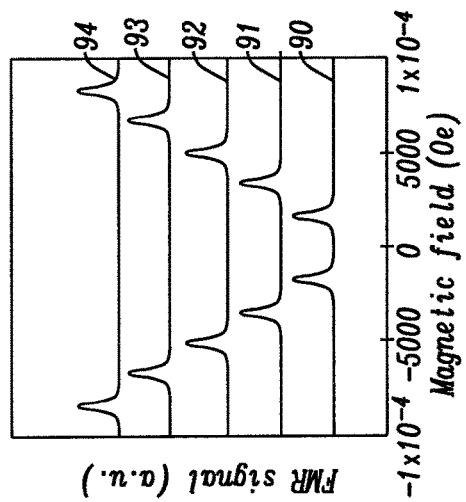
FIG. 12
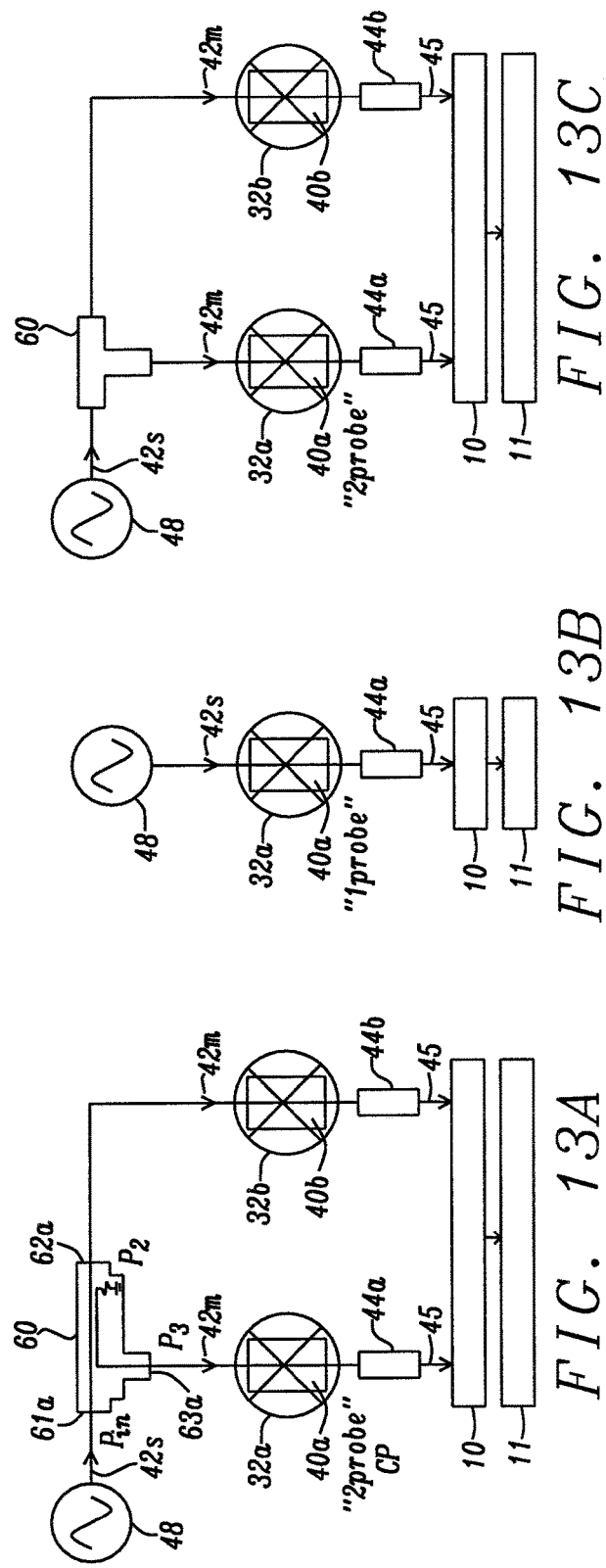
FIG. 13A
FIG. 13B
FIG. 13C

MULTI-PROBE FERROMAGNETIC RESONANCE (FMR) APPARATUS FOR WAFER LEVEL CHARACTERIZATION OF MAGNETIC FILMS

RELATED PATENT APPLICATIONS

This application is related to Ser. No. 15/463,074, filing date Mar. 20, 2017; and Ser. No. 15/875,004, filing date Jan. 19, 2018, which are assigned to a common assignee and herein incorporated by reference in their entirety.

TECHNICAL FIELD

The present disclosure relates to a FMR apparatus for measuring magnetic properties in magnetic films at a plurality of sites on a whole wafer, and a system for doing the same comprised of a magnetic assembly with one or more magnetic field sources, and a plurality of RF probes that are mounted on a platform to enable multiple sites to be measured simultaneously or consecutively without moving the platform relative to the wafer thereby substantially decreasing the FMR measurement time per wafer.

BACKGROUND

Magnetic thin films and multilayers play a key role in various types of magnetic storage devices such as a magnetic hard disk (HDD) drive, Magnetic Random Access Memory (MRAM), spin torque oscillator (STO), and magnetic domain wall devices. In order to develop and optimize such devices, monitoring and characterization of magnetic thin film stacks is essential. A variety of different magnetic characterization techniques must be used to determine all the essential magnetic parameters such as crystalline anisotropy, surface or interface anisotropy, magnetization saturation (Ms), damping constant ($\alpha$), gyromagnetic ratio ($\gamma$), inhomogeneous broadening ($L_0$), resistance x area product (RA), and magnetoresistive ratio (MR).

FMR techniques are well suited to measure anisotropy fields, as well as the gyromagnetic ratio $\gamma$, and the damping constant $\alpha$ of magnetic films and multilayers in extended unpatterned films or over an area comprising a large array of sub-micron patterned structures. The resonance frequency $f_R$ of a ferromagnetic film is given by the so-called Kittel formula shown in equation (1) below where $H_R$ is the resonance field applied perpendicular to the plane of the film, $H_K$ is the effective anisotropy field which includes structural, surface, and magnetostatic contributions, and $\gamma$ is the gyromagnetic ratio.

$$2\pi f_R = \gamma (H_R + H_K) \quad \text{(Eq. 1)}$$

A FMR experiment comprises probing the magnetic system (thin film, multilayer stack, or structured device) with a combination of microwave excitation and a quasi-static magnetic field. FMR data is obtained by either sweeping the magnetic field at a constant microwave frequency, or by sweeping the frequency at a constant field. When the ferromagnetic resonance condition is achieved, it may be detected by an enhanced absorption of the microwave (RF signal) by the ferromagnetic sample. The absorption is at a maximum at a specific frequency corresponding to the resonance frequency ($f_R$) of the sample where $f_R$ depends on the static field applied to the sample as well as its magnetic properties. Thus, resonance (FMR) conditions are defined using pairs of magnetic field and microwave frequency values ($H_R$, $f_R$).

Although conventional FMR experiments were done by placing a small sample in a resonant cavity between the poles of an electromagnet, waveguide based techniques, which have been developed during the past decade, are especially well suited to analyze film geometry. In particular, the wafer under test (WUT) is placed in contact with a waveguide transmission line (WGTL) that may be in the form of a grounded coplanar waveguide (GCPWG), coplanar waveguide (CPWG), co-axial waveguide (CWG), stripline (SL), or a microstrip (MS). The WGTL is used both to transmit microwaves to the sample, and to detect FMR absorption as a function of the applied magnetic field and microwave frequency.

Referring to FIG. 1A, a schematic depiction is shown where output voltages are plotted as a function of a variable magnetic field at constant microwave frequency using five different values (f1-f5) of microwave frequency. The center and width of the Lorentzian peaks is extracted from the data as a function of the excitation microwave frequency. As mentioned previously, the center field is the resonance field ($H_R$), which is related to the excitation microwave frequency following the Kittel formula that is rewritten in a slightly different form in equation (2) below where h is the Planck constant, g is the Lande factor and $\mu_B$ is the Bohr magneton.

$$H_R(f) = [h/(g \times \mu_B)] \times f - H_K \quad \text{(Eq. 2)}$$

The variation of $H_R$ with microwave frequency is shown in FIG. 1B where each of the points along curve 21 is derived from one of the Lorentzian shaped peaks Hr1-Hr5 in FIG. 1A. As indicated by equation (2), the extrapolation of the data to f=0 gives the value of the effective anisotropy field $H_K$.

The linewidth L of the resonance peak is the width at half amplitude $\Delta H$ of the resonance peak and is related to dissipative processes involved in magnetization dynamics as well as to possible distributions of different magnetic thin film parameters such as $H_K$ or Ms. The linewidth depends on the excitation frequency and the dimensionless Gilbert damping constant $\alpha$ according to equation (3) below where $L_0$ is an inhomogeneous broadening. By fitting $H_R$ and L with respect to the excitation frequency $f_R$, $H_K$ as well as $\alpha$, $L_0$ and g may be derived.

$$L(f) = (2h\alpha/(g \times \mu_B))f + L_0 \quad \text{(Eq. 3)}$$

A vector network analyzer (VNA) for detecting FMR in thin CoFe and CoFeB films on a coplanar waveguide is described by C. Bilzer et al. in "Vector network analyzer ferromagnetic resonance of thin films on coplanar waveguides: Comparison of different evaluation methods" in J. of Applied Physics 101, 074505 (2007), and in "Open-Circuit One-Port Network Analyzer Ferromagnetic Resonance" in IEEE Trans. Magn., Vol. 44, No. 11, p. 3265 (2008). In these experiments, the planar WGTL is typically attached to radiofrequency (RF) connectors by microwave electrical probes and placed between the poles of an electromagnet. Thus, given the size of the WGTL and the size of the gap of typical electromagnets, only small samples (normally <1 inch in diameter) can be measured. Accordingly, wafers typically used in the microelectronics industry (having diameters of 6, 8, 12 inches or more) can only be measured with this FMR technique if they are cut into small coupons.

Since conventional FMR techniques are destructive, time consuming, and limited to measuring small pieces of a wafer, they are undesirable to an extent that prevents wide acceptance of FMR as a characterization tool in the magnetic data storage industry. An improved FMR measurement system and technique is needed that enables fully automated measurements on whole wafers for faster throughput and lower cost. Moreover, the improved FMR system should be constructed from commercially available parts.

SUMMARY

One objective of the present disclosure is to provide a fully automated FMR system that enables a plurality of sites on a whole wafer to be measured simultaneously or consecutively without lateral movement of a FMR probe relative to the wafer.

A second objective of the present disclosure is to provide a fully automated FMR system according to the first objective where there is flexibility in RF power distribution to a plurality of RF probes.

These objectives are achieved according to one embodiment of the present disclosure with a FMR measurement system that is configured with a plurality of "m" RF probes where "m" is an integer $\geq 2$ and each having a RF input from a RF generator and a RF output to a separate RF diode (total of "n" RF diodes where m=n), and wherein each RF probe performs a FMR measurement at a predetermined location or $(x_i, y_i)$ coordinate on a wafer under test (WUT). In other embodiments, there may be "n" RF diodes linked to "m" RF probes where n<m. In preferred embodiments, the RF probes are attached to a mounting plate and installed in an electrical probe station that is controlled by a computer. Each RF probe functions as a waveguide transmission line (WGTL) and is in the form of a microstrip, stripline, coplanar waveguide, grounded coplanar waveguide, a form of printed circuit board transmission line, a coaxial waveguide or any other microwave connector, as well as a commercial RF electrical probes comprising but not limited to GS, SG, GSG, GSSG or similar configurations (where G refers to ground path and S refers to signal path), or an antenna.

During FMR measurements, a RF probe contacts a portion of a magnetic structure to be measured on the WUT or is placed within 100 microns of the WUT. In one embodiment, there is a plurality of "m" magnetic poles joined to the mounting plate such that a magnetic field is simultaneously applied vertically to each of "m" predetermined locations while a RF probe applies one or more microwave frequencies thereby inducing a FMR condition in the magnetic film at each selected $(x_i, y_i)$ coordinate on the WUT. In order to deliver a RF microwave signal from the RF generator to each and every RF probe, a multi-port RF power distribution device with a high level of isolation between output ports is used. The RF power distribution device may be one of several types of RF microwave components and devices capable of distributing and/or combining RF microwave signals, which include but are not limited to power splitters, power dividers, directional couplers, hybrid couplers, microstrip couplers, and waveguide couplers. Wilkinson power dividers, for instance, provide in addition to equal splitting amplitude of the input signal (as many other power dividers) a high level of isolation between output ports while ensuring a matched condition at all output ports. In other embodiments, multiple RF power distribution devices are connected either sequentially in series or in a "tree-like" configuration to deliver the RF microwave signal from the RF generator to each and every RF probe. A tree-like configuration is defined as a structure where one input ends in two or more outputs, and each output may lead to a new input that in turn ends in two or more outputs to provide a branch layout.

In another embodiment, the magnetic assembly comprises a plurality of "m" sets of two magnetic poles that are positioned on either side of each of the "m" RF probes thereby providing an in-plane magnetic field to the magnetic film during the RF measurements. The magnetic poles are preferably proximate to the magnetic film on the WUT but are not contacting a top surface thereof.

According to one embodiment that represents a RF transmission mode for performing the FMR measurements, each output port of the RF power distribution device is attached through a RF input cable to a first connector on a RF probe. Thus, a RF signal may pass through a signal (S) pathway in the RF probe while a magnetic field is applied to the magnetic structure contacted by or in proximity to the RF probe. When the RF signal excites the magnetic layers in the test structure, there is a power loss that is transmitted through the S pathway in the RF probe and detected by a RF diode, which is linked to a second connector on the RF probe through a RF output cable. Each of the "m" RF probes is connected to one of the "n" RF diodes to transmit a separate signal to a control computer for analysis. There may be a data acquisition (DAQ) system or voltmeter in order to transmit the data acquired from each RF diode to the control computer. The transmitted power at each test location is typically measured in response to different applied RF frequencies and as a function of applied field. In alternative embodiments, the transmitted power at each test location may be measured as a function of the applied RF frequency for different applied magnetic fields.

In an alternative embodiment that is a reflectance FMR measurement mode, the components in the first embodiment are retained except a directional coupler is inserted in each link between a RF probe and an output port of the RF power distribution device. The output RF signal is sent from the directional coupler to the RF diode and then to the DAQ system and the control computer.

In all embodiments, each of the "m" RF probes transmits a sequence of RF microwave frequencies (RF input signals) to a selected location on the WUT. A FMR condition is established at each predetermined location in the magnetic film or patterned structure with each applied RF microwave frequency, and the extent of RF microwave absorption is dependent on the magnitude of the RF microwave frequency, the applied magnetic field, and the magnetic properties in the magnetic film or patterned structure. As a result of FMR absorption, there is a power loss between the input RF signal and the output RF signal that is detected by the RF power diode. The RF power diode converts each RF output signal to a voltage readout that is routed to the DAQ system and the control computer to determine Hk, and $\alpha$, for example, for the magnetic structure.

In an alternative embodiment, FMR measurements and/or data acquisition are done consecutively. For this method, RF routing devices may be used. RF routing devices are defined as electrical devices with multiple input ports and/or multiple output ports enabling the selection of one input port/output port pair to ensure a transmission signal path from one device to another. Contrary to RF power distribution devices, which distribute power to all the outputs at the same time, RF routing devices distribute power to only one output at a time. Examples of such routing devices include, but are not limited to, RF electromechanical switches or solid state switches. In one embodiment of a consecutive measurement, a multi-port RF electrical switch (or a plurality of RF switches connected in a "tree-like" configuration) is used to route the RF microwave signal from the RF microwave generator to one of the RF probes. For this embodiment, a multi-port RF electrical switch (or a plurality of RF switches connected in a "tree-like" configuration) can also be used to route the RF output signal from each and every RF probe to a single RF power diode.

Since a single controller (control computer) may be employed to manage all aspects of the testing including up and down movement of the mounting plate relative to the WUT, RF signal processing, magnetic field generation, and compilation of the test data, throughput is optimized so that the FMR measurement system is said to be fully automated, and may be readily implemented in an engineering or production environment. Moreover, the RF probes, magnetic assembly, mounting plate, and RF circuit components including the RF power distribution devices, RF power diodes, and RF routing devices are commercially available and may be readily configured to provide a reliable FMR measurement system.

BRIEF DESCRIPTION OF THE DRAWINGS

FIG. 12 is a plot of acquired data from a RF diode as a function of various applied magnetic fields at different RF microwave frequencies according to an embodiment of the present disclosure.

FIG. 13A is a diagram showing the layout of a two RF probe FMR measurement scheme ("2probe") where the RF power distribution device is a broadband RF directional coupler, and where measurements are performed simultaneously at different locations on a WUT.

FIG. 13B is a diagram showing the layout of a single FMR measurement ("1 probe") where one location of a single WUT is measured.

FIG. 13C is a diagram wherein the layout in FIG. 13A is modified by replacing the broadband RF directional coupler with a RF power divider having two output ports according to an embodiment of the present disclosure.

DETAILED DESCRIPTION

The present disclosure is a FMR measurement system that is capable of simultaneously or consecutively measuring magnetic properties including $H_K$ and a in magnetic films or in patterned magnetic structures at a plurality of predetermined locations on a WUT where the locations may be substantially smaller than 1 mm in diameter. A plurality of "m" RF probes and "n" RF diodes (where n is an integer 1≤n≤m) are configured in either a RF transmission mode or a RF reflectance mode for FMR measurements. Each test location has an x-axis and y-axis ($x_i$, $y_i$) coordinate on the WUT and is in a plane that is aligned parallel to and above the plane of a wafer chuck. The terms "RF" and "microwave" may be used interchangeably as well as "controller", "computer" or "control computer". It should be understood that the term "magnetic film" may refer to one layer, a plurality of magnetic layers formed in a stack of layers, or a plurality of patterned magnetic structures such as magnetic tunnel junction (MTJ) cells in magnetic random access memory (MRAM) arrays on the WUT. The present disclosure also encompasses an embodiment (not shown) where the simultaneous FMR measurement scheme described herein is incorporated in a scanning FMR measurement system that was previously described in related U.S. patent applications with Ser. Nos. 15/463,074 and 15/875,004.

Therefore, the simultaneous measurement at "m" locations may be repeated one or more times to probe a total of "2m" or "3m" different locations, for example, by moving the WUT for each set of "m" different locations.

In related U.S. patent application Ser. No. 15/463,074, we disclosed a FMR measurement system that relies on a WGTL that is attached to RF input and RF output connectors and is capable of taking measurements at a plurality of sites on a whole wafer. However, the area probed in the measurement is quite large (mm to cm diameter) compared with sub-micron dimensions in memory device structures. In related U.S. patent application Ser. No. 15/875,004, we disclosed an improved FMR measurement system constructed from commercially available components, and that enables magnetic properties to be monitored and measured in smaller structures substantially less than 1 mm in diameter. However, the scanning method requires total measurement time to be more than 1 hour in order to probe an 8" wafer at 20 different locations for a typical experiment. Here, we disclose a new FMR measurement system having a configuration that enables total measurement time for a plurality of "m" locations to be reduced to less than 5 minutes for an 8" wafer, which is a significant improvement in an engineering or production environment. Much faster measurements can also allow for longer averaging times at each probing location, thus improving the signal to noise ratio of the experiment.

Figure 1A:
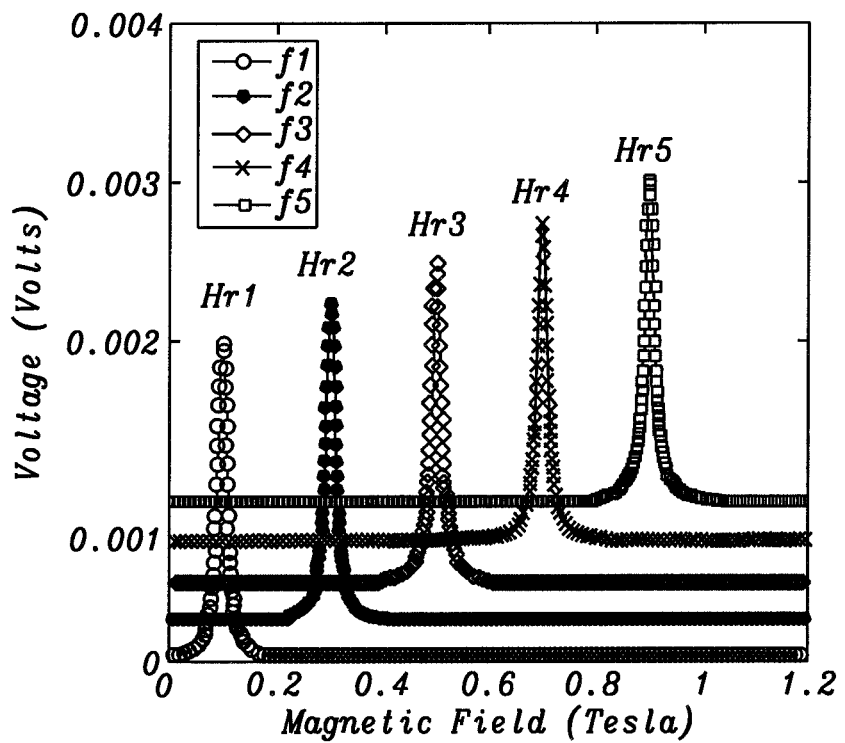
FIG. 1A shows a schematic description of the typical series of Lorentzian shaped peaks derived from ferromagnetic resonance measurements taken for 24 GHz to 48 GHz microwave frequencies.
Figure 1B:
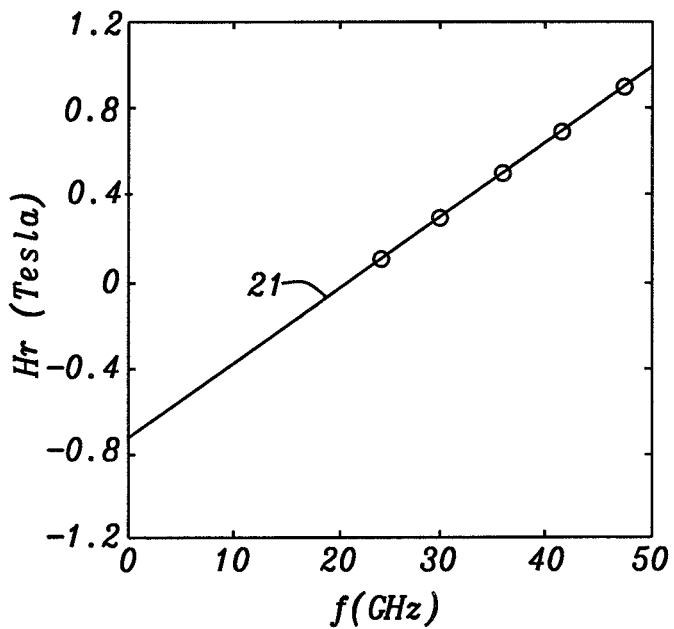
FIG. 1B shows a plot of resonance field ($H_R$) as a function of the microwave frequencies used in FIG. 1A.
Figure 2A:
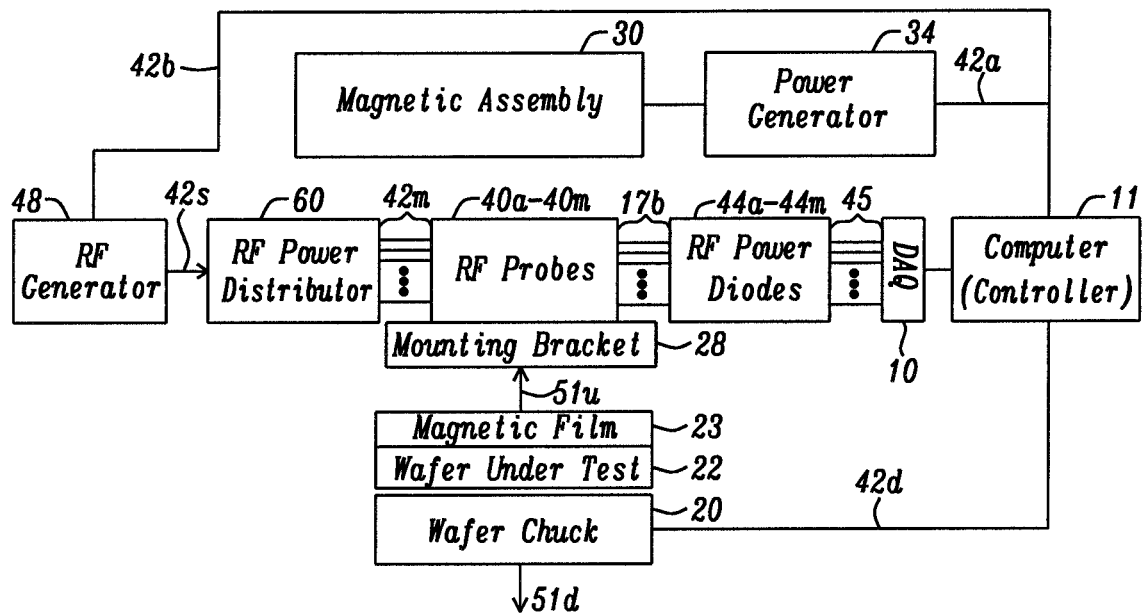
FIG. 2A is a diagram showing the various components of a fully automated simultaneous FMR measurement system according to a first embodiment of the present disclosure.

Referring to FIG. 2A, one embodiment of a FMR measurement system according to the present disclosure is depicted in a diagram that shows the layout of the key components. There is a computer 11 to manage the up movement 51$u$ or down movement 51$d$ of the prober stage also known as wafer chuck 20, and WUT 22 on which the magnetic film 23 to be tested is formed. The WUT is held on a top surface of the wafer chuck by a vacuum. Prior to the FMR measurement process, an alignment process is typically performed where a dummy wafer with the desired test locations marked is aligned by moving the mounting plate so that the RF probe is positioned over each of the test locations. Thereafter, each WUT is brought to the same "alignment" position as determined by the dummy wafer, and only vertical movements of the WUT relative to the mounting plate occur before and after a FMR measurement process on each WUT. Accordingly, the wafer chuck and WUT may be raised with respect to the mounting plate so that each of the "m" RF probes 40$a$-40$m$ contacts or is proximate to a predetermined test location on the WUT where "m" is an integer ≥2. An electrical probe station may be employed to position the mounting plate above the WUT with respect to lateral movement (x-axis and y-axis directions), and also to manage the vertical approach to adjust contact or proximity to the WUT as directed by the controller. However, in another embodiment, the RF probes may be attached to a probe card.

The magnetic assembly 30 is comprised of at least one magnetic field source, but may include a plurality of "k" magnetic poles (k being an integer 1≤k≤m) in some embodiments. In other embodiments, the magnetic assembly may comprise one or more coils of superconducting wires so that no magnetic poles are necessary. Computer 11 has a link 42$a$ to power generator 34 (or plurality of power generators) that produces power to form magnetic flux in one or more magnetic poles in the magnetic assembly. Accordingly, a magnetic field is applied simultaneously or consecutively to "m" different predetermined ($x_i$, $y_i$) coordinates (test locations) on the WUT while a RF signal pathway in each RF probe 40$a$-40$m$ contacts top surface 23$t$ of the magnetic film at a corresponding ($x_i$, $y_i$) coordinate. RF signals may be delivered to each of the RF probes by using RF power distribution devices or RF power routing devices. Simultaneous application of a microwave frequency (RF input signal) from a RF probe, and an applied magnetic field ($H_{ap}$) of up to 3 Tesla from a magnetic pole induces a FMR condition (RF power absorbance) in the magnetic film proximate to each ($x_i$, $y_i$) coordinate on the WUT. In other embodiments (not shown), $H_{ap}$ may be applied from a magnetic field source using a multi-axis vector magnet, or applied across the entire WUT, for example, using a wide-bore superconducting magnet. Note that the applied magnetic field does not need to be uniform across the WUT as long as the field is properly calibrated at each predetermined measurement location.

The RF output signal from each RF probe 40$a$-40$m$ is detected by a corresponding RF diode 44$a$-44$m$, which collects a RF output signal transmitted from the magnetic film and that exits each RF probe through a signal pathway and second RF connector (not shown). Each RF output signal corresponds to a RF power loss caused by the FMR condition where a certain amount of microwave power is absorbed and excites the magnetic film to a resonance state. Each FMR measurement at a ($x_i$, $y_i$) coordinate may comprise a plurality of RF input signals each corresponding to a different RF frequency.

Controller 11 has an electrical connection 42$b$ to RF generator 48 that provides a RF input signal 42$s$ to a RF power distribution device 60. According to one embodiment, the number of output ports in the RF power distribution device matches the number of "m" RF probes so that each RF probe receives a RF input signal 42$m$ from a separate output port. Each input signal is transported through one of the RF transmission lines 100$a$-100$m$ shown in FIG. 2E. However, there may be a plurality of RF power distribution devices so that a first RF power distribution device with $m_1$ output ports transmits RF signals to a first set of $m_1$ RF probes, and at least a second RF power distribution device with $m_2$ output ports transmits RF signals to a second set of $m_2$ RF probes where $m_1+m_2=m$. In yet another embodiment, the distribution element employed to deliver a RF input signal 42$m$ to each RF probe may be a combination of RF power distribution devices such as a broadband RF power divider and one or more broadband RF directional coupler devices such that the RF power divider splits the RF input signal to two or more sets of one or more RF probes while the RF directional couplers transmit the split RF input signal to a second set of one or more RF probes. Note that the output connector 17$b$ is comprised of a plurality of RF transmission lines 101$a$-101$m$ between RF probes 40$a$-40$m$ and RF diodes 44$a$-44$m$ as shown in FIG. 2E. Also, DC output 45 is transmitted through a plurality of transmission lines 102$a$-102$m$ from the RF diodes to DAQ 10.

In a preferred operating mode for a FMR measurement, the applied magnetic field is varied (swept from a minimum to a maximum value) at a constant microwave frequency. The FMR measurement is preferably repeated by sweeping the magnetic field successively through each of a plurality of different microwave frequencies. In one embodiment, each RF diode 44$a$-44$m$ converts the power output from one of the plurality of "m" RF probes 40$a$-40$m$ to a voltage signal that is transmitted to DAQ system 10. This DAQ system digitizes the voltage output signals from each RF probe, allowing them to be processed by the controller 11. Thereafter, the controller 11 calculates $H_k$, $\alpha$, $\gamma$ and inhomogeneous broadening ($L_0$) based on each pair of applied magnetic field value and applied microwave frequency used to establish a FMR condition, and on voltage output data from each RF diode that contacts a specific ($x_i$, $y_i$) coordinate selected for a FMR measurement.

Figure 2B:
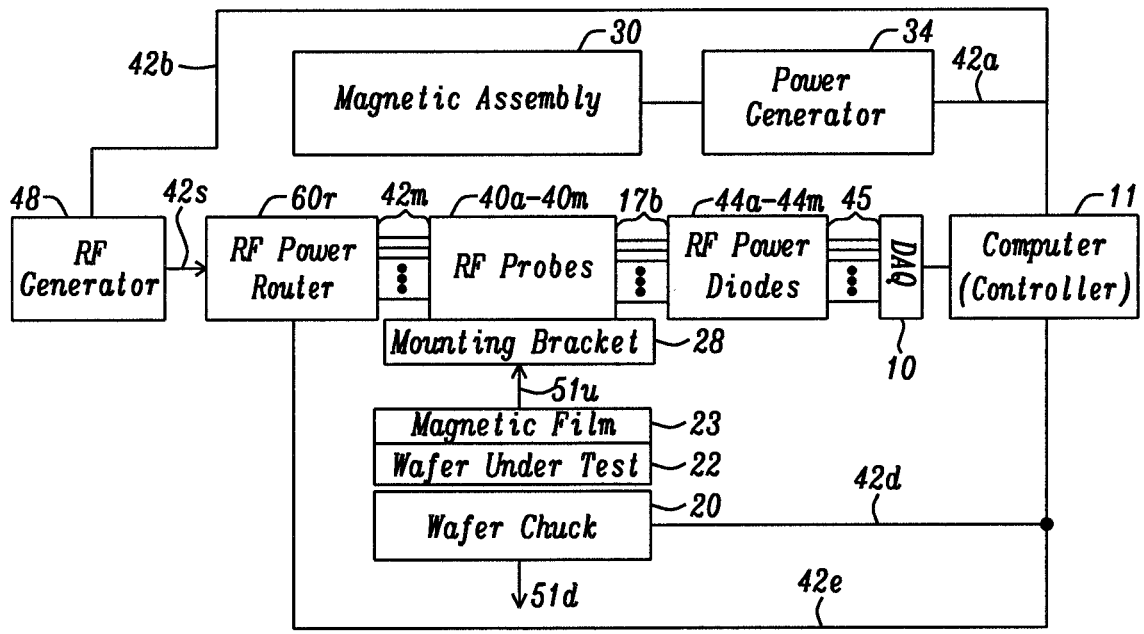
FIG. 2B is a schematic drawing of an FMR system of the present disclosure wherein a RF power routing device is used to address the RF input power to a predetermined RF probe for consecutive FMR measurements.

In another embodiment depicted in FIG. 2B, the FMR system has a RF power routing device 60r that is used to distribute the RF input power 42s to a predetermined RF probe (one of 40a-40m) through one of the 42m pathways described previously to enable consecutive FMR measurements. All other features of the previous embodiment in FIG. 2A are retained. The power routing device may be comprised of multiport electro-mechanic or solid-state RF switches (or multiple RF switches connected in a "tree-like" configuration as shown in FIG. 2D) that are used to route the microwave input signal from the RF generator 48 to one of the RF probes 40a-40m. The power routing device is connected through link 42e to the computer 11, which is programmed to access all the RF probes consecutively. Although this method is in general slower than simultaneous measurements, it can be useful in some special cases for which high input power is needed. Indeed, in this case, the full input RF power is routed to a single RF probe instead of being split between several RF probes. Note that RF routing devices can be switched rapidly, allowing for faster measurements than when a single RF probe is used for measuring a plurality of locations on the WUT.

Figure 2C:
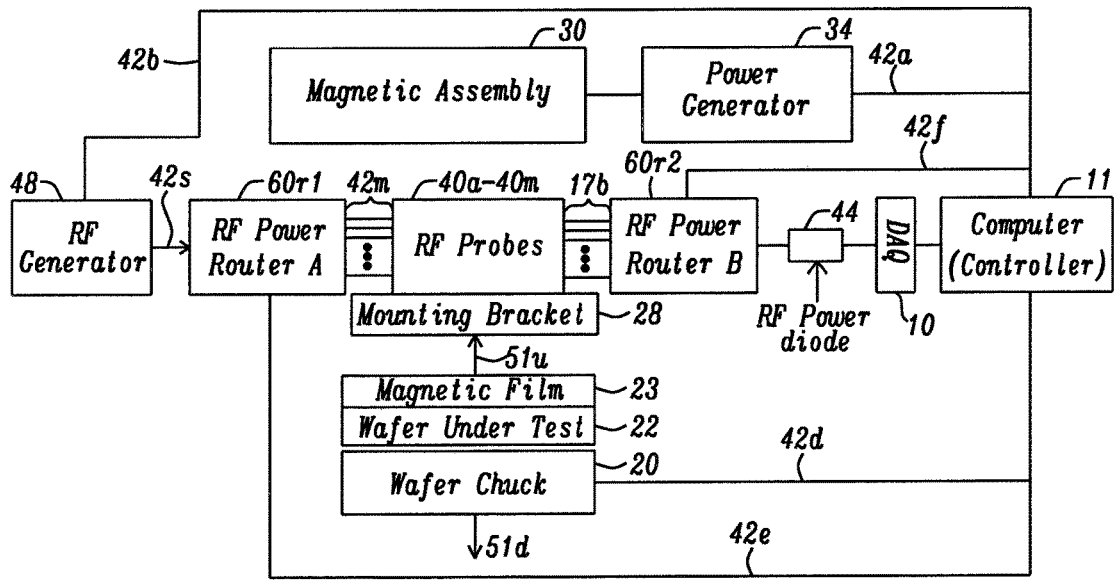
FIG. 2C is a schematic drawing of an FMR system of the present disclosure wherein a first RF power routing device distributes the RF input power to a predetermined RF probe and a second RF power routing device routes a RF output signal to a RF power diode to enable consecutive FMR measurements.
Figure 2D:
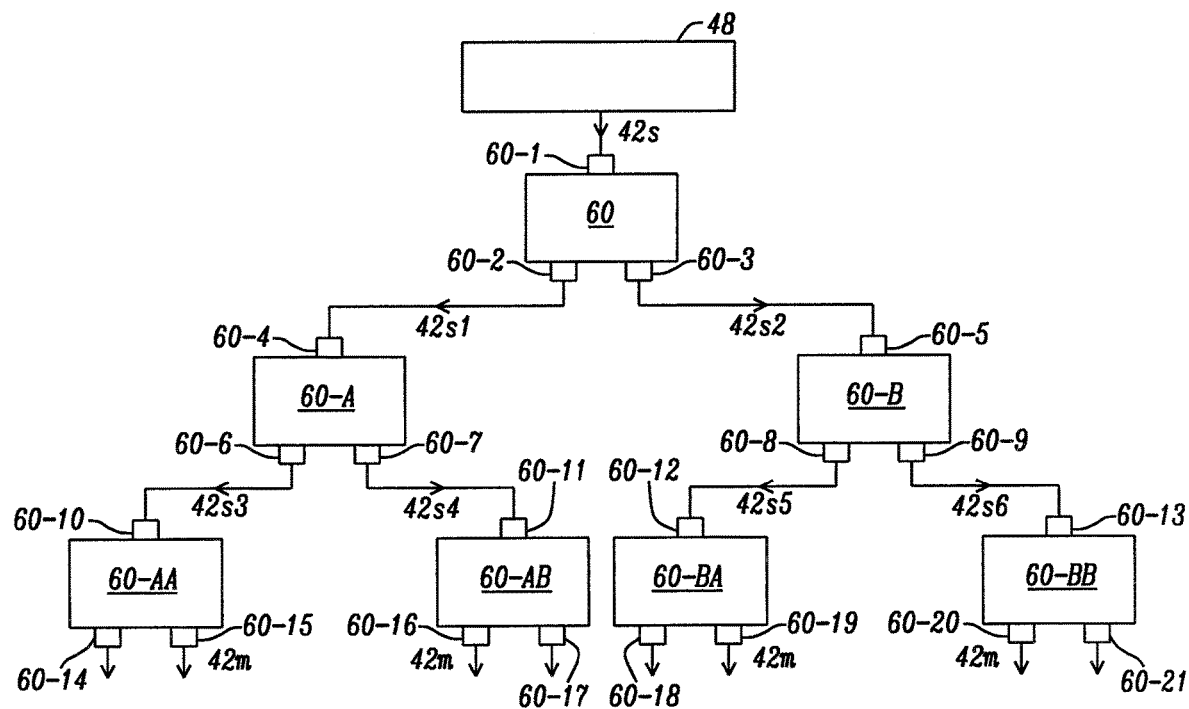
FIG. 2D is a schematic drawing that shows a "tree-like" configuration for either a RF power distributor device or a RF power routing device used in a FMR measurement according to an embodiment of the present disclosure.
Figure 2E:
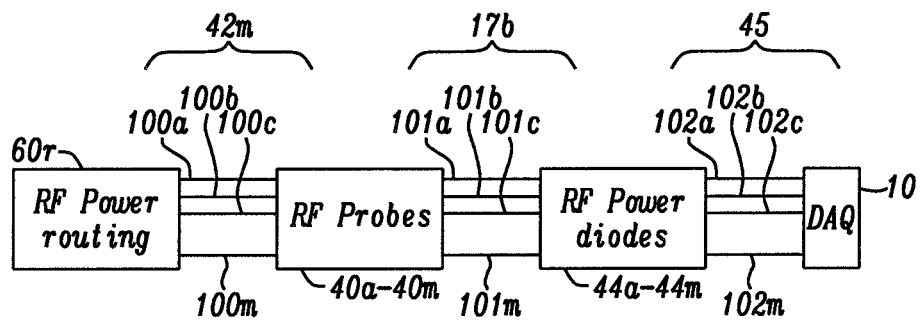
FIG. 2E is an enlargement of the RF transmission pathways from the RF power routing/distribution device to a plurality of RF probes, from the RF probes to a plurality of RF diodes, and from the RF diodes to a data acquisition system according to various embodiments of the present disclosure.

The present disclosure also encompasses another embodiment shown in FIG. 2C where the FMR system is configured to enable consecutive FMR measurements and is a modification of the previous embodiment. There is a first RF power routing device 60r1 used to distribute the RF input power to a predetermined RF probe (one of 40a-40m). Thus, a RF input signal 42s from the RF generator is routed from the RF power routing device to a RF probe through one of the 42m pathways. In addition, there is a second RF power routing device 60r2 between the RF probes and a RF diode 44 that is employed to select a RF output signal of a predetermined RF probe and then send the RF output signal to the RF diode. A link 42f is provided between the computer 11 and second RF routing device to manage the routing of RF output signals.

According to another embodiment in FIG. 2D, a tree-like configuration is depicted that may serve as either a RF power distributor shown in FIG. 2A, or as a RF power routing device depicted in FIGS. 2B-2C, and hereafter described in general terms as a RF d/r device. RF input signals 42s from the RF generator are sent to a first port 60-1 of RF d/r device 60. First and second RF signals 42s1, 42s2 are then transmitted from ports 60-2, 60-3, respectively, to RF d/r devices 60-A (port 60-4), and 60-B (port 60-5), respectively. Thereafter, RF signals from RF d/r device 60-A ports 60-6, 60-7 are transmitted to RF d/r devices 60-AA (port 60-10) and 60-AB (port 60-11), respectively, and RF signals from RF d/r device 60-B ports 60-8, 60-9 are transmitted to RF d/r devices 60-BA (port 60-12), and 60-BB (port 60-13), respectively. Subsequently, RF input signals 42m from RF d/r devices 60-AA (ports 60-14, 60-15), 60-AB (ports 60-16, 60-17), 60-BA (ports 60-18, 60-19), and 60-BB (ports 60-20, 60-21) are sent to RF probes 40a-40m. Note that each tier (60-A+60-B) and (60-AA+60-AB+60-BA+60-BB) is optional so the tree-like configuration may be shortened to include only RF d/r device 60, or only three RF d/r devices 60, 60-A, and 60-B, for example. Furthermore, an additional tier with eight more RF d/r devices (not shown) may be provided below the third tier (60-AA+60-AB+60-BA+60-BB) so that up to sixteen RF input signals 42m through pathways 100a-100m (FIG. 2E) may be transmitted to RF probes in a RF power distribution scheme rather than a maximum of eight RF input signals 42m from the exemplary embodiment. The RF power routing option enables a minimum of only one pathway through one or more tiers of devices to be active for a certain period of time such that a RF input signal 42m is transmitted to only one RF probe through one of the pathways 100a-100m (FIG. 2E) to measure a first predetermined location on a WUT. Other RF probes to measure additional predetermined locations may be activated in consecutive fashion with RF input signals through other pathways 100a-100m.

The present disclosure encompasses designs other than those illustrated in FIGS. 2A-2D that may be employed to generate the microwave excitation (FMR condition) of a magnetic film sample, and detect the power absorption therein. For instance, a vector network analyzer (VNA) may be used as a RF output generator and RF input analyzer. In another embodiment related to pulsed inductive microwave magnetometry (PIMM), a pulse generator and a time-resolved oscilloscope may serve as a RF source and RF analyzer, respectively. In yet another embodiment, a lock-in amplifier detection technique known to those skilled in the art may be employed to amplify the FMR output signal, which indicates the power loss from each FMR condition. Furthermore, a plurality of RF generators may replace a single RF microwave source including a configuration where each of plurality of "p" RF generators (where p is an integer $1 < p \le m$) are configured to provide a sequence of RF input signals to a different RF probe, or where a first RF generator supplies RF input signals to a first group of one or more probes, and at least a second RF generator sends RF input signals to a second group of one or more RF probes.

Figure 3:
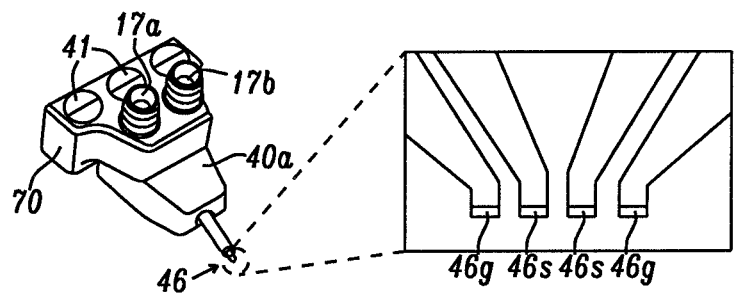
FIG. 3 is an oblique view of a RF probe that includes two sets of pathways (two for ground and two for signals) that is part of the fully automated FMR measurement system according to an embodiment of the present disclosure.

Referring to FIG. 3, an oblique view of a commercially available RF probe 40a is depicted that is duplicated in the other RF probes 40b-40m (not shown). The RF probe is attached to a chassis 70 by screws 41. First and second RF connectors 17a, 17b, respectively, that are attached to the RF probe are shown protruding from a top surface of the chassis. The RF probe tip 46 extends from a front face of the RF probe and in the exemplary embodiment has two sets of probe ends arranged in a GSSG pattern according to one embodiment where G probe ends 46g are ground pathways, and S probe ends 46s are signal pathways that each contact a top surface of a magnetic structure or film (not shown) to be tested. In some embodiments, the S and G probe ends have a diameter that is on the order of tens of microns, although a bottom portion thereof that contacts a top surface of the magnetic film may have a dimension proximate to 1 micron. In other embodiments, the RF probe tip may have alternative designs such as GS, SG, and GSG that are well known in the art.

During a transmission mode of FMR measurement, the RF input signal is transmitted to the magnetic film through one of the signal pathways 46s, and the RF output signal to one of the RF diodes passes through the other of the signal pathways 46s. Optionally, a two GS, SG, or GSG probe design may replace a GSSG probe design where an S pathway in a first RF probe carries RF input signals, and an S pathway in the second RF probe carries RF output signals. In an alternative embodiment, relating to a reflectance mode of FMR measurement, the RF input signal and RF output signal pass through the same signal pathway to and from the magnetic film. Accordingly, the RF probe tip may have a GS, GSG, or SG configuration, or a GSSG configuration where the second S pathway is unused.

A RF probe is not limited to the design in FIG. 3 and may be a microstrip, stripline, coplanar waveguide, grounded coplanar waveguide, a form of printed circuit board transmission line, micro cavity, coaxial waveguide, or a form of microwave antenna that are all known in the art.

Figure 4:
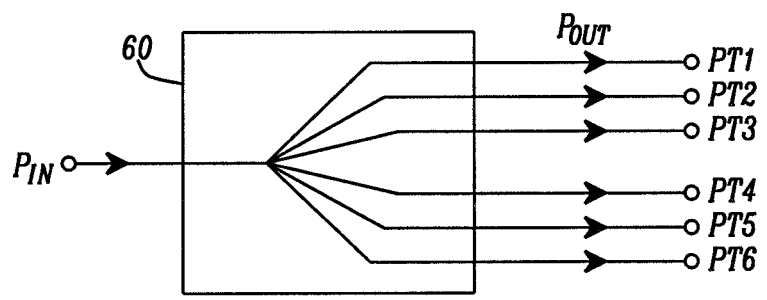
FIG. 4 is a diagram of a multi-port RF power divider that is employed to deliver a RF input signal to multiple RF probes in a FMR measurement system according to an embodiment of the present disclosure.

Referring to FIG. 4, one embodiment of a RF power distribution device 60 such as a Wilkinson power divider described in "An N-Way Hybrid Power Divider", IRE Trans. on Microwave Theory and Techniques", Vol. 8, p. 116-118 (1960) is depicted. Although FIG. 4 shows 6 output ports PT1-PT6, the number of ports may be ≥2 and equal to "m" according to an embodiment of the present disclosure such that each of the "m" output ports sends a RF signal to one of the RF probes 40a-40m described previously. Wilkinson power dividers may provide in addition to equal splitting amplitude as other commercial RF power dividers, a high level of isolation (typically from 15 dB to 30 dB) between output ports while ensuring a matched condition at all ports. Broadband 4-way Wilkinson power dividers up to 50 GHz are commercially available.

Figure 5:
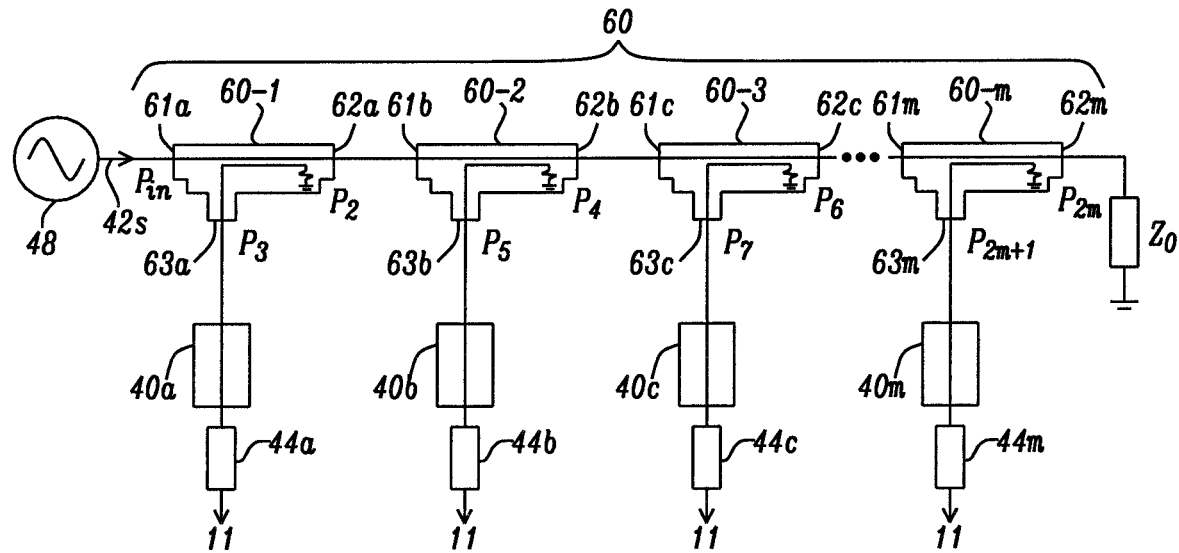
FIG. 5 is a diagram of multiple RF directional couplers connected in series that are used to deliver a RF input signal to multiple RF probes in a transmission mode according to another embodiment of the present disclosure.

In another embodiment shown in FIG. 5, a RF input signal 42s from RF generator 48 is sent to a multi-port RF directional coupler device 60 configured by multiple broadband RF directional couplers connected in series in a transmission FMR measurement mode, and comprised of "m" broadband RF directional couplers 60-1, 60-2, 60-3, and up to 60-m each having an input port 61a, 61b, 61c, and 61m, respectively, a transmission port 62a, 62b, 62c, and 62m, respectively, and a coupled port 63a, 63b, 63c, and 63m, respectively. RF directional couplers can also offer a high level of isolation (usually 15 dB to 30 dB) between output (coupled and transmission) ports. Thus, a plurality of "m" RF directional couplers may be connected in series to deliver a RF signal to each of the "m" RF probes 40a-40m from a plurality of "m" coupled ports 63a-63m.

Considering that the isolation between each RF directional coupler is at least 15 dB, the reflected signal from each RF probe that would be transmitted to the next RF probe would be attenuated at least 30 dB ensuring a desirable level of isolation between each FMR test location corresponding to a $(x_i, y_i)$ coordinate on the WUT. Therefore, the RF input signal to RF probe 40a has a power $P_3$, the RF input signal to RF probe 40b has a power $P_5$, the RF input signal to RF probe 40c has a power $P_7$, and the RF input signal to RF probe 40m has a power $P_{2m+1}$ where $P_3 > P_5 > P_7 > P_{2m+1}$. The RF signal ($P_{2m}$) from the final transmission port 62m is grounded. It should be understood that even though there may be a considerable power difference between $P_3$ and $P_{2m+1}$, FMR measurement reliability is not particularly sensitive to power magnitude which means usable RF output signals are collected from all of the "m" RF probes 40a-40m.

According to the exemplary embodiment, the RF output signal from each RF probe is transmitted to the corresponding RF diode during FMR measurements. In other words, RF output from RF probe 40a at a first test coordinate is transmitted to RF diode 44a, RF output from RF probe 40b at a second test coordinate is transmitted to RF diode 44b, and so forth up to RF output from RF probe 40m at an mth test coordinate that is transmitted to RF diode 44m. Thereafter, each RF diode transmits a RF output signal to computer 11, preferably through a DAQ system 10 shown in FIG. 2. A RF diode may be a Schottky diode or another RF diode wherein a voltage signal is produced corresponding to the RF power loss during a microwave absorption (FMR condition) at a test location in the magnetic film.

Figure 6:
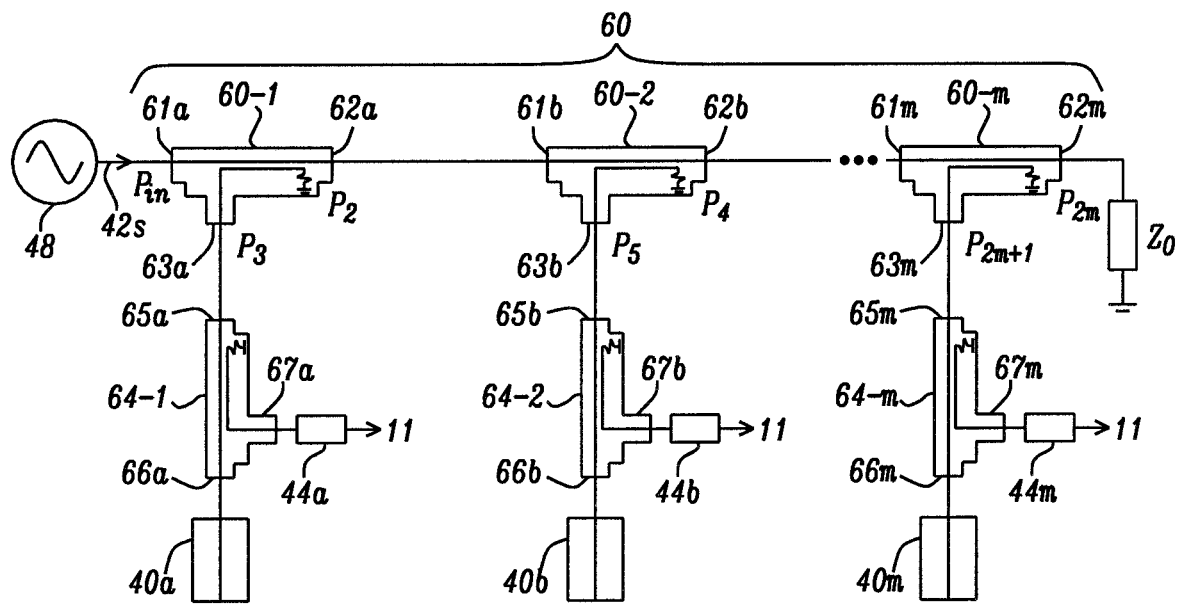
FIG. 6 is a diagram of a multiple RF directional coupler configuration that is used to deliver a RF input signal to multiple RF probes in a reflectance mode according to an embodiment of the present disclosure.

Referring to FIG. 6, an alternative directional coupler scheme is illustrated for use in a FMR measurement reflectance mode. The directional coupler device 60 with a plurality of directional couplers 60-1 to 60-m arranged in series is maintained from the previous embodiment. However, each RF probe 40a-40m is configured in a reflectance mode, i.e. terminated by an open-circuit, wherein the RF input signal transmitted to a test location through a signal pathway in the RF probe is reflected back as the RF output signal from the test location through the same signal path. Accordingly, a second set of directional couplers 64-1 to 64-m is employed wherein one of the second set of directional couplers is inserted between each pair of coupled output ports 63a-63m and RF probes 40a-40m. Each of the directional couplers 64-1, 64-2, 64-3, and up to 64-m has an input port 65a, 65b, 65c, and 65m, respectively, that receives a RF signal from an output port 63a, 63b, 63c, and 63m, respectively, and has an output port 66a, 66b, 66c, and 66m, respectively that sends a RF signal to RF probe 40a, 40b, 40c, and up to 40m, respectively. Part of the RF output signals reflected back from RF probes 40a, 40b, 40c, and 40m will be transmitted through output ports 67a, 67b, 67c, and 67m, respectively, to RF diodes 44a, 44b, 44c, and 44m, respectively. Each RF output signal that is received by a RF diode is converted to a voltage signal and transmitted to a DAQ system 10 and computer 11 for data acquisition and processing.

Figure 7:
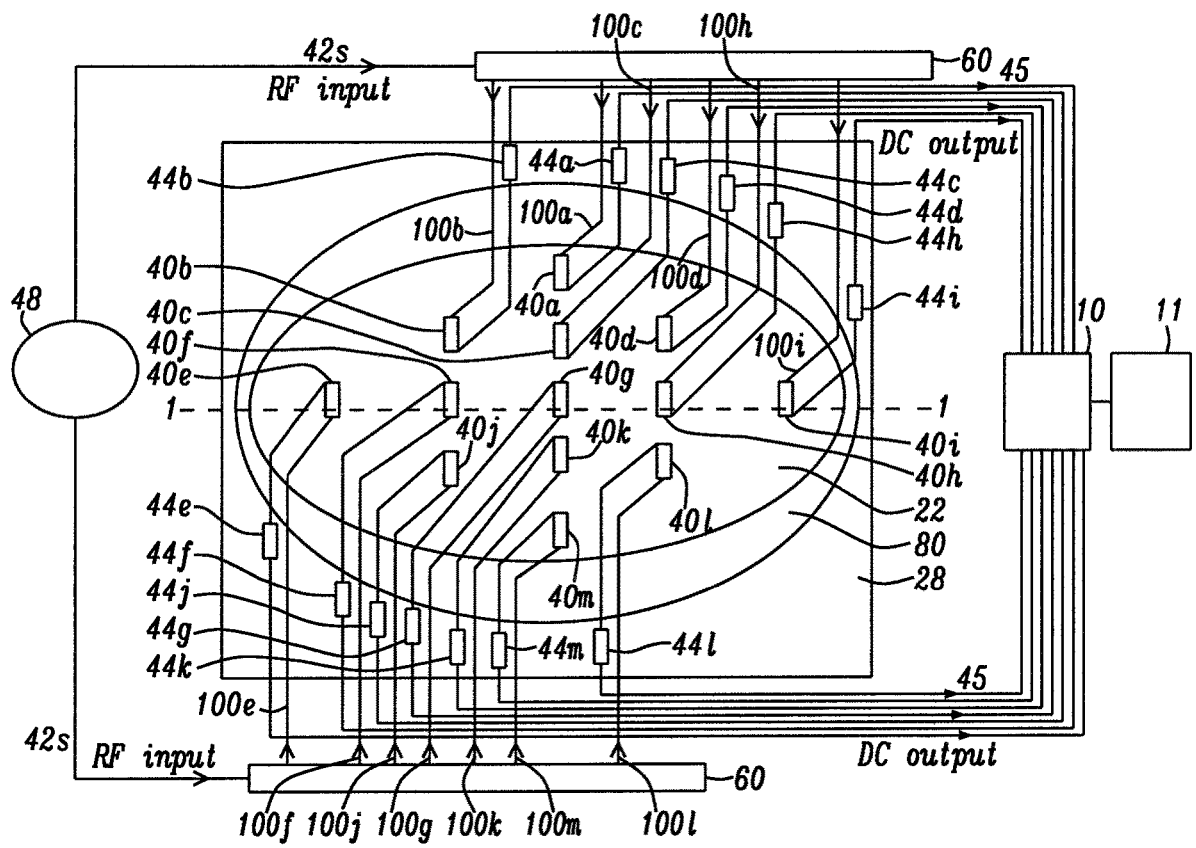
FIG. 7 shows a FMR measurement layout configured with a multi-port RF power distribution device that delivers a RF input signal to multiple RF probes each aligned over a predetermined location on a WUT according to an embodiment of the present disclosure.

FIG. 7 shows one embodiment of a FMR test apparatus of the present disclosure. In particular, an array of "m" RF probes 40a-40m is formed in an array of rows and columns and positioned above the WUT 22 that may have a 6", 8", or 12" diameter, for example. In the exemplary embodiment, there are 13 RF probes laid out in five rows and columns that are spaced substantially equally across the wafer. However, instead of m=13, the value of "m" may be any integer ≥2 which means the array of RF probes on the wafer may have any design including but not limited to a linear shape, a pattern of rows and columns, or an irregular shape. In one embodiment, each RF probe is positioned in contact with or proximate to a different sector of the WUT during a FMR measurement where each sector has a fixed x-axis dimension and fixed y-axis dimension around a certain $(x_i, y_i)$ center point. A sector may correspond to a square or rectangular shaped chip (die) or a block of chips in the magnetic film on the WUT.

The WUT is shown below a circular opening 80 that is formed within mounting plate 28. The magnetic assembly is not shown in this drawing in order to focus on the path of RF input from RF generator 48 to the multi-port RF power distribution device 60 and then the paths of the multiple RF input signals from the RF power distribution device to each RF probe. Two multi-port RF power distribution devices 60 on opposite sides of the WUT are shown to more clearly indicate RF input/output pathways. However, in an actual FMR measurement apparatus, there may be only one multi-port RF power distribution device with a connection to each of the "m" RF probes, or more than two RF power distribution devices. RF signals 42m are transmitted from a power distribution device 60 through pathway 100a to RF probe 40a, through pathway 100b to RF probe 40b, and so forth up to pathway 100m to RF probe 40m. Each link between a RF probe and a RF diode is one of the 101a-101m pathways shown in FIG. 2E. Moreover, each link that carries a DC output signal between a RF diode and DAQ 10 is one of the 102a-102m pathways in FIG. 2E. Thus, DC output 45 from each of the RF diodes 44a-44m is transmitted to at least one DAQ system 10 and computer 11 after the diodes receive RF output signals from RF probes during a FMR measurement process.

According to the exemplary embodiment, a plurality of RF probes 40e-40i contact five different test locations formed proximate to center plane 1-1 that bisects WUT 22.

Moreover, another four RF probes 40a-40d contact test locations in the upper half of the WUT (above the center plane) while the remaining four RF probes 40j-40m contact test locations in the lower half of the WUT. According to a preferred embodiment, the mounting plate 28 with magnetic assembly (not shown), multi-port RF power distribution devices 60, and RF probes are installed on a commercial electrical probe station that is available from different vendors. This exemplary embodiment will allow measuring 13 different locations simultaneously in a wafer-sized magnetic film.

Figure 8:
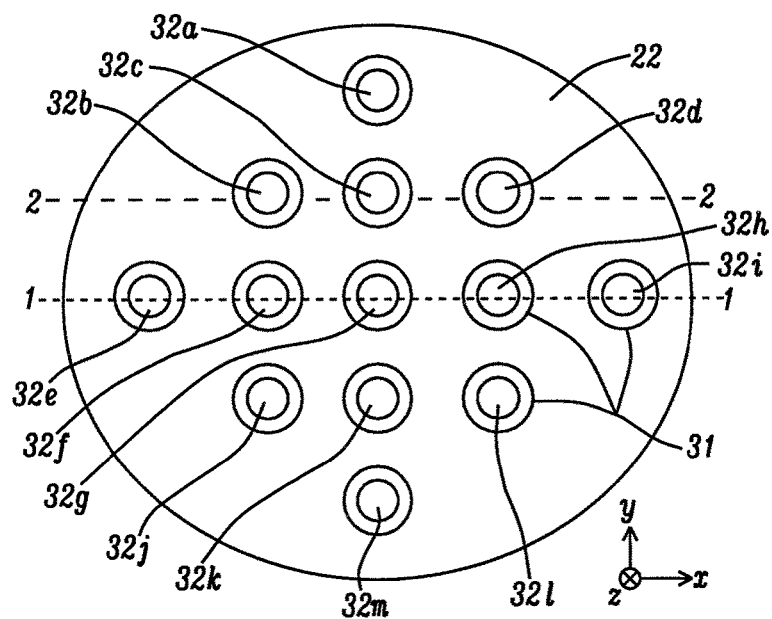
FIG. 8 shows a top-down view of a magnetic assembly comprised of "m" magnetic poles that are aligned over each predetermined FMR measurement location on a WUT according to an embodiment of the present disclosure.

In FIG. 8, a top-down view is shown of a magnetic assembly configuration that is compatible with the layout of RF probes and RF diodes in FIG. 7. Each of "m" magnetic poles 32a-32m is shown with a surrounding coil 31 that generates a magnetic field in the magnetic pole formed within. Each magnetic pole preferably has a pole tip aligned above one of the (xi, yi) test locations and proximate to one of the RF probes 40a-40m depicted in FIG. 7. For example, at plane 2-2 that is parallel to center plane 1-1, there is a magnetic pole 32b in proximity to RF probe 40b at a first test location, a magnetic pole 32c in proximity to RF probe 40c at a second test location, and a magnetic pole 32d in proximity to RF probe 40d at a third test location. Accordingly, the "m" magnetic poles are arranged in essentially the same design used for the "m" RF probes shown in FIG. 7. In other embodiments, larger magnetic poles can be used so each pole tip could be aligned to several (xi, yi) test locations. In such a case, a magnetic assembly configuration with "k" magnetic poles (where k is an integer 1≤k≤m) would be necessary.

Figure 9:
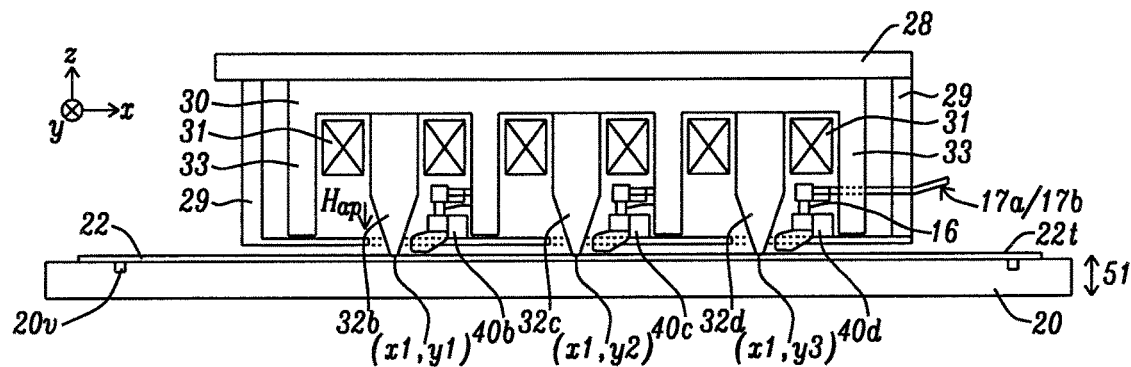
FIG. 9 is a cross-sectional view of a magnetic assembly that is aligned over a plurality of RF probes to enable multiple FMR measurements with out-of-plane magnetic fields to be taken simultaneously on a WUT according to an embodiment of the present disclosure.

In FIG. 9, a cross-sectional view is shown at plane 2-2 in FIG. 8 according to one embodiment of the present disclosure and depicts magnetic assembly comprised of magnetic poles 32b, 32c, and 32d held by mounting plate 28. Each magnetic pole is formed between return poles 33. Each RF probe including RF probe 40b with a probe tip contacting or proximate to the first test location at $(x_1, y_1)$, RF probe 40c with a probe tip contacting or proximate to the second test location $(x_1, y_2)$, and RF probe 40d with a probe tip contacting or proximate to the third test location $(x_1, y_3)$, is attached to a mounting bracket 29, which is an extension of the mounting plate.

Wafer chuck 20 has a plurality of holes 20v in a top surface thereof to allow a vacuum to be applied and hold the WUT 22 in position. The wafer chuck may move vertically 51 to bring the RF probes in contact with the test locations, or place the RF probes within a distance <100 microns above the magnetic film (not shown) on the WUT. RF input and output cables 17a, 17b, respectively, are connected to each RF probe through a 90° elbow connector 16 in the exemplary embodiment. During a FMR measurement, a magnetic field $H_{ap}$ is applied in a direction orthogonal to WUT top surface 22t simultaneously with a microwave frequency from RF probes at the selected $(x_i, y_i)$ coordinates corresponding to "m" test locations across the WUT. The present disclosure anticipates that the magnetic field and microwave frequency may be applied simultaneously at all "m" test locations, or consecutively wherein a first location is tested before a second location in succession up to an mth location is tested. Preferably, all locations are tested simultaneously to minimize total FMR measurement time. RF frequencies employed for FMR measurements with this magnetic assembly are typically in the range of 1 to 100 GHz.

Figure 10:
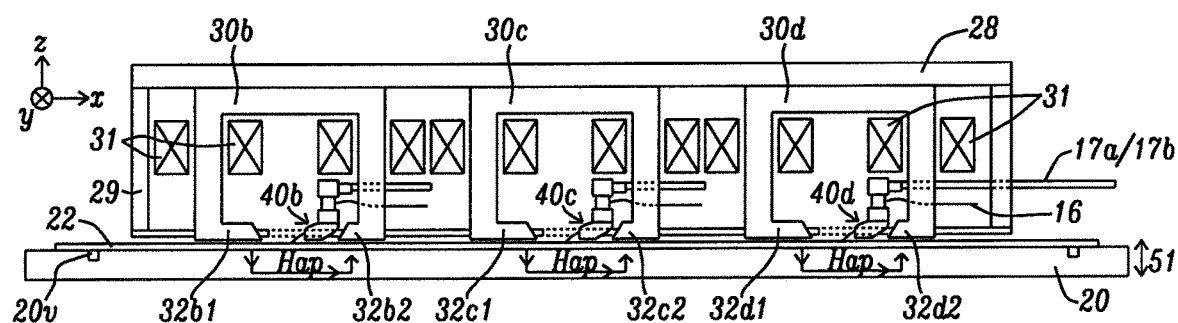
FIG. 10 is cross-sectional view of a magnetic assembly with two magnetic poles on opposite sides of each RF probe to enable multiple FMR measurements with in-plane magnetic fields to be taken simultaneously on a WUT according to an embodiment of the present disclosure.

Referring to FIG. 10, a cross-sectional view taken at plane 2-2 in FIG. 8 is shown according to another embodiment of the present disclosure. Here, the magnetic assembly is comprised of sub-units 30b, 30c, 30d adjoined to mounting plate 28. RF probes 40b, 40c, and 40d are in contact with, or are proximate to the first, second, and third test locations, respectively, as described in the previous embodiment. Each sub-unit has two magnetic poles that are surrounded by coils 31. Thus, magnetic poles 32b1, 32b2 in sub-unit 30b are positioned on opposite sides of RF probe 40b, and proximate to the WUT 22 but do not touch the magnetic film (not shown). Likewise, magnetic poles 32c1, 32c2 in sub-unit 30c are positioned on opposite sides of RF probe 40c while magnetic poles 32d1, 32d2 in sub-unit 30d are positioned on opposite sides of RF probe 40d. The pole configuration produces a magnetic field $H_{ap}$ in the plane of the magnetic film proximate to each $(x_i, y_i)$ coordinate where a RF probe tip is positioned. Note that for such in-plane configuration, the magnetic assembly can also be configured in such a way that magnetic poles at each sub-unit are positioned transverse to the RF probe (enabling for shorter distance between the poles, and therefore higher in-plane magnetic fields). Applied RF frequencies during FMR measurements for this magnetic assembly configuration may be in the range of 0.01 to 100 GHz.

Figure 11:
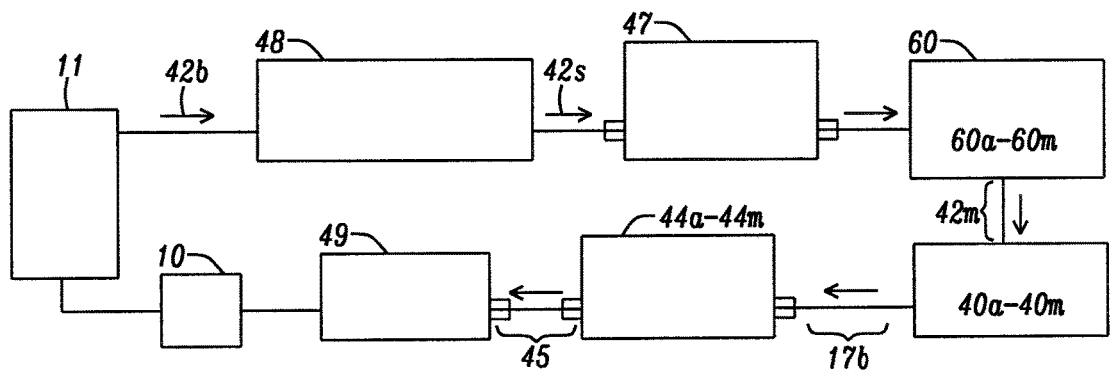
FIG. 11 shows a flow diagram of a RF input signal pathway to a RF power distribution device and a RF output signal pathway to a computer according to an embodiment of the present disclosure.

Referring to FIG. 11, a schematic drawing of a FMR measurement system in FIG. 2A is modified to show a RF pathway that is configured to include a frequency multiplier module 47 such as an active frequency doubler, which is placed between the RF generator 48 and the multi-port RF power distribution device 60. Furthermore, a low noise amplifier (or multiple low noise amplifiers) 49 may be included between one or more of the RF diodes 44a-44m and computer 11 to compensate for power loss induced by the power distribution, and improve FMR signal sensitivity. Preferably, there is a DAQ system 10 positioned between the plurality of RF diodes and computer 11 that receives DC output 45 in the form of analog voltage signals from each of the RF diodes (or from the one or more low noise amplifiers), and converts the data to digital signals that are transmitted to the computer for data acquisition and analysis.

As indicated earlier, it is important that each magnetic pole is aligned, at least, over one of the $(x_i, y_i)$ coordinates where a RF probe tip makes contact with or is proximate to a top surface of the magnetic film 23 (shown in FIG. 2) so that each test location is exposed to both of an applied magnetic field $(H_{ap})$ and a RF frequency $(f_R)$ that may induce a FMR condition for each FMR measurement. Moreover, the magnetic field may be applied in a direction orthogonal to the WUT 22 as in FIG. 9, or in the plane of the magnetic film or magnetic structure on the WUT as in FIG. 10.

During a FMR measurement when a magnetic field is applied to an area around a $(x_i, y_i)$ coordinate, a portion of the microwave power supplied by the RF input signal through an RF input cable 17a to one of the RF probes 40a-40m is absorbed by the magnetic film during a FMR condition so that the RF output signal carried through RF output cable 17b and through a corresponding RF power diode 44a-44m in a RF output pathway has reduced power compared with the RF input signal. The RF power diode converts the RF output signal for each $(H_{ap}, f_R)$ pair to a voltage measurement that is relayed to the computer 11. The amplitude of the applied magnetic field $(H_{ap})$ may be varied for a given RF frequency $(f_R)$, or a plurality of RF frequencies may be applied with a constant magnetic field during each FMR measurement. Preferably, the applied magnetic field is swept from a minimum to a maximum value at a constant microwave frequency (F1), and then the FMR measurement is repeated by sweeping the magnetic field successively with each of a plurality of different microwave frequencies (F2, F3, . . . Fn). Alternatively, the RF frequency may be swept from a minimum to a maximum value for each applied magnetic field in a series of increasing magnitudes from H1, H2, and so forth up to Hn during a FMR measurement.

Computer 11 uses the FMR measurement data from each test location and one or more of equations (1)-(3) described previously to determine $H_K$, α, γ, and inhomogeneous broadening ($L_0$) at each of the selected ($x_i$, $y_i$) coordinates on the magnetic film, which may be a stack of layers in an unpatterned film, or in a plurality of patterned devices having sub-millimeter or even sub-micron dimensions along the x-axis and y-axis directions.

Using the RF transmission mode embodiment described earlier, we performed FMR measurements on full (unpatterned) film structures. FIG. 12 depicts a typical data set that results from one test location associated with one of the predetermined ($x_i$, $y_i$) coordinates. In this example, transmitted RF power is measured for five different frequencies as a function of the applied magnetic field on an uncut 8-inch diameter wafer (WUT). FMR spectra in the form of curves 90, 91, 92, 93, and 94 are generated with RF frequencies of 20 GHz, 25 GHz, 30 GHz, 35 GHz, and 40 GHz, respectively, and sweeping the magnetic field between −1.0 Tesla (−10000 Oe) and 1.0 Tesla (10000 Oe) according to a FMR measurement method of the present disclosure. In a sequential configuration (all predetermined locations are tested consecutively one after the other) the total FMR measurement time for the entire WUT depends on the predetermined number of "m" ($x_i$, $y_i$) coordinates to be included in the FMR measurement sequence. However, in a simultaneous configuration (wherein all predetermined locations are tested simultaneously), the total FMR measurement time is equal to the FMR measurement time per location and therefore independent of the predetermined number of "m" ($x_i$, $y_i$) coordinates to be measured. This implies that the total FMR measurement time may be reduced to less than 5 minutes per WUT when all of the locations are tested simultaneously.

The following comparison experiment was performed in order to demonstrate the effectiveness (proof of concept) of the RF power distribution device aspect wherein a plurality of RF input signals for FMR measurements is provided at a plurality of test locations on a WUT (according to embodiments of the present disclosure) with no impact on the measured FMR spectra.

Referring to FIG. 13A, two different MTJ stacks {Sample 1 (S1) and Sample 2 (S2)} with similar effective anisotropy fields (Hk~6 kOe) were measured simultaneously at different locations in a "2probe" FMR measurement system. In such a system, a RF directional coupler 60 with a 10-40 GHz bandwidth, a nominal coupling of 10 dB, and directivity >10 dB is used as a RF power distribution device. Microwave excitation (RF signal 42s) with power $P_{IN}$ is sent from RF generator 48 to input port 61a of the RF directional coupler 60. In the exemplary embodiment, one RF signal 42m with power P3 is transmitted from coupled port 63a to CPWG probe 40a and a second RF signal 42m with power P2 (P3<P2<$P_{IN}$) is transmitted from transmission port 62a to CPWG probe 40b. Detection of the RF output signals 45 from RF diodes 44a and 44b is made in a transmission mode and transmitted to a DAQ system 10 and controller 11 described previously.

Both stacks S1 & S2 are characterized at the center of the wafer by different CPWG probes. In one configuration, stack S1 at a first test location is characterized by a CPWG probe 40a while stack S2 at a second location is characterized by CPWG probe 40b. In this configuration, S1 is characterized by the RF input signal 42m transmitted from coupled port 63a as sketched in FIG. 13A ("2 probe-CP" configuration). Alternatively, in another configuration, stack S1 at a first test location is characterized by a CPWG probe 40b while stack S2 at a second location is characterized by CPWG probe 40a. In this configuration S1 is characterized by the RF input signal 42m transmitted from transmission port 62a in the same directional coupler ("2 probe-TP" configuration, not shown).

In FIG. 13B, a second part of the comparison experiment is depicted where each of the stacks S1 and S2 were measured separately during different time periods with a single CPWG probe 40a and single magnetic pole 32a according to a transmission mode embodiment of related patent application Ser. Nos. 15/463,074 and 15/875,004 ("1 probe" FMR configuration). Here, RF signal 42s from RF generator 48 is sent directly to the CPWG probe, and RF output signals 45 are transmitted through RF diode 44a to controller 11 via a DAQ system 10.

Figure 14A:
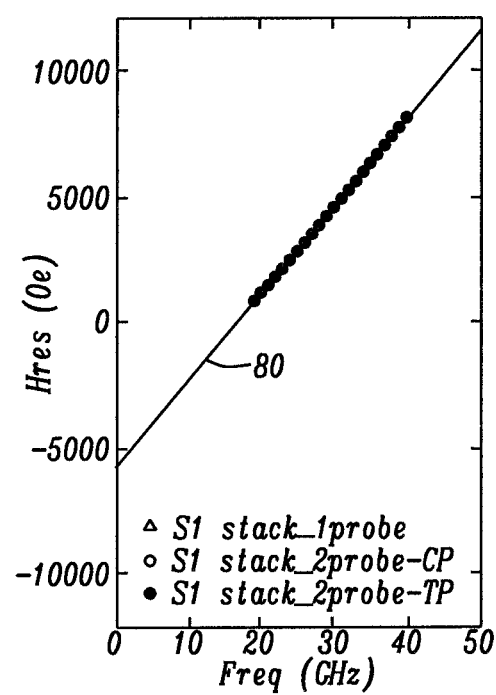
FIGS. 14A-14B show a comparison of experimental results between a "2probe" FMR configuration (FIG. 13A) and a "1probe" FMR configuration (FIG. 13B).
Figure 14B:
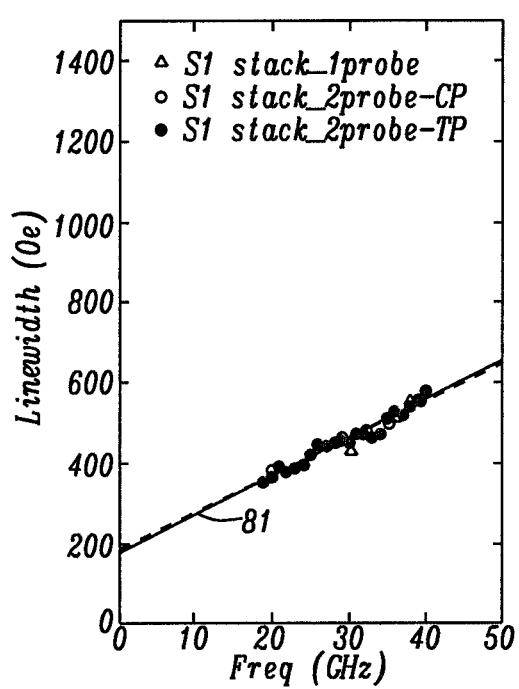

FIG. 14A shows the frequency dependence of resonance field (Hres) and linewidth of the S1 stack for the three different FMR measurement configurations labeled as: "1 probe" where center of S1 stack is measured alone (FIG. 13B), "2probe-CP" where both S1 and S2 stacks are measured simultaneously and S1 stack is measured through coupled port 63a of RF directional coupler (FIG. 13A), and "2probe-TP" where both S1 and S2 stacks are measured simultaneously and S1 stack is measured through transmission port 62a of RF directional coupler (not shown). We observe that all three configurations have the same frequency dependence of Hres (line 80 in FIG. 14A) and linewidth (line 81 in FIG. 14B). Therefore, all three configurations yield identical results for MTJ stack S1 showing the high level of isolation between each RF probe in the previously described "2probe" FMR measurement scheme. There is also excellent agreement between FMR spectra derived from "1probe" measurements and the "2probe" embodiment comprising a power divider shown in FIG. 13C (results not shown).

All components required to assemble a FMR measurement apparatus and system for either the transmission mode or reflectance mode embodiments that comprise either a perpendicular magnetic field or an in-plane field described herein are commercially available.

While this disclosure has been particularly shown and described with reference to the preferred embodiment thereof, it will be understood by those skilled in the art that various changes in form and details may be made without departing from the spirit and scope of this disclosure.

We claim:

1. A ferromagnetic resonance (FMR) measurement system that is configured to determine magnetic properties in one or more magnetic films or magnetic structures at a plurality of "m" predetermined locations on an entire wafer under test (WUT) where "m" is an integer ≥2, comprising:
    a plurality of "m" RF probes each to enable transmission of a RF input signal from at least one RF generator to the one or more magnetic films or magnetic structures at each of the predetermined locations;
    a magnetic assembly comprised of at least one magnetic field source that provides a magnetic field proximate to each of the plurality of RF probes such that a simultaneous application of the RF input signal at a microwave frequency and the magnetic field induces a FMR condition in the magnetic film or plurality of device structures at each of the predetermined locations;

"n" RF diodes where n is an integer 1≤n≤m, wherein each RF diode collects a RF output signal from one or more RF probes when the FMR condition occurs at each of the predetermined locations;
a device to deliver the RF input signal from the RF generator to each of the RF probes; and
a controller (computer) to manage an application of the microwave frequency and magnetic field, and to receive an output signal from each RF diode, and wherein an acquisition of each output signal is converted to data comprised of one or more magnetic properties.

2. The FMR measurement system of claim 1 wherein the device that delivers the RF input signal from the at least one RF generator to each of the RF probes is a "RF power distribution device" that delivers the RF input signal to all the RF probes simultaneously.

3. The FMR measurement system of claim 1 wherein the device that delivers the RF input signal from the at least one RF generator to each of the RF probes is a "RF power routing device" that delivers the RF input signal to all RF probes consecutively.

4. The FMR measurement system of claim 1 wherein the device that delivers the RF input signal from the at least one RF generator to each of the RF probes is comprised of a combination of one or both of at least one "RF power distribution" device and at least one "RF power routing" device.

5. The FMR measurement system of claim 2 wherein the RF power distribution device is comprised of a broadband RF multi-port directional coupler.

6. The FMR measurement system of claim 2 wherein the RF power distribution device is configured with a plurality of "m" broadband RF directional couplers connected in series such that each of the broadband RF directional couplers transmits a RF signal to one of the "m" RF probes.

7. The FMR measurement system of claim 2 wherein the RF power distribution device is comprised of a broadband multi-port Wilkinson power divider.

8. The FMR measurement system of claim 7 wherein the Wilkinson power divider has a plurality of "m" output ports such that each output port transmits a RF signal to one of the "m" RF probes.

9. The FMR measurement system of claim 2 wherein the RF power distribution device has a plurality of "m" output ports such that each output port transmits a RF signal to one of the "m" RF probes.

10. The FMR measurement system of claim 2 wherein the RF power distribution device is comprised of a plurality of RF power distribution devices connected in series, or in a "tree-like" configuration, or both.

11. The FMR measurement system of claim 3 wherein the RF power routing device is comprised of an electromechanical RF switch, or a solid state RF switch with a multiplicity of outputs.

12. The FMR measurement system of claim 3 wherein the RF power routing device has a plurality of "m" output ports such that the RF signal is distributed to each of the "m" RF probes continuously.

13. The FMR measurement system of claim 3 wherein the RF power routing device is comprised of a plurality of electromechanical RF switches or solid state RF switches connected in series, or in a "tree-like" configuration, or both.

14. The FMR measurement system of claim 3 wherein the RF power routing device is comprised of a plurality of RF power routing devices connected in series, or in a "tree-like" configuration, or both.

15. The FMR measurement system of claim 3 wherein at least an additional RF power routing device is used to route the output signal of each RF probe to the "n" RF diodes.

16. The FMR measurement system of claim 1 that is configured in a transmission mode wherein the RF input signal from the at least one RF generator is transmitted through a first RF connector of each RF probe and then to the WUT through a first RF probe end or a first transmission line, and wherein the RF microwave signal emitted by the WUT is collected either by a second RF probe end or by the first transmission line of each RF probe and wherein the RF output signal is then transmitted to a RF power diode through a second RF connector.

17. The FMR measurement system of claim 1 that is configured in a reflectance mode wherein each RF probe is terminated by an open-circuit configuration, and wherein the RF input signal from the at least one RF generator is transmitted through an RF input connector of each RF probe to the WUT through a first RF probe end or transmission line, and wherein the RF microwave signal emitted by the WUT is collected by the first RF probe end or transmission line of each RF probe, and wherein the RF output signal is then transmitted to a RF power diode through the RF input connector.

18. The FMR measurement system of claim 1 further comprised of a Data Acquisition (DAQ) system inserted between the plurality of "n" RF diodes and the controller.

19. The FMR measurement system of claim 1 wherein the magnetic assembly has a plurality of "k" magnetic poles (where k is an integer 1≤k≤m), and wherein each magnetic pole is aligned above at least one of the RF probes, such that the magnetic field is applied in a direction that is orthogonal to the WUT at each of the predetermined locations.

20. The FMR measurement system of claim 19 wherein the applied microwave frequency is in a range of 1 GHz to 100 GHz.

21. The FMR measurement system of claim 1 wherein the magnetic assembly has a plurality of "2m" magnetic poles wherein two magnetic poles are positioned on opposite sides of each RF probe tip, and the magnetic field is applied in an in-plane direction at each of the one or more predetermined locations.

22. The FMR measurement system of claim 21 wherein the applied microwave frequency is in a range of 0.01 GHz to 100 GHz.

23. The FMR measurement system of claim 1 wherein the RF probes and magnetic assembly are installed in an electrical probe station.

24. The FMR measurement system of claim 1 wherein the RF probes are attached to a probe card or mounting plate.

25. The FMR measurement system of claim 1 wherein the RF probes are comprised of microstrips, striplines, coplanar waveguides, or grounded coplanar waveguides.

26. The FMR measurement system of claim 1 wherein the RF probes are comprised of a form of printed circuit board transmission line, microcavities, coaxial waveguides, RF electrical probes, or a form of RF antenna.

27. The FMR measurement system of claim 1 wherein the magnetic assembly comprises a multi-axis vector magnet, or a superconducting magnet.

28. The FMR measurement system of claim 1 wherein the magnetic field is up to 3 Tesla.

29. The FMR measurement system of claim 1 wherein each RF probe contacts the one or more magnetic films or magnetic structures, or is within about 100 microns of the one or more magnetic films or magnetic structures.

30. The FMR measurement system of claim 1 wherein one or more RF amplifiers are included between the at least one RF generator and the device to deliver the RF input signal in order to compensate for the loss of power induced by the device to deliver the RF input signal from the at least one RF generator to each of the RF probes.

31. The FMR measurement system of claim 1 wherein one or more low noise amplifiers are used to enhance the output signal of at least one RF power diode to improve FMR signal sensitivity.

32. The FMR measurement system of claim 1 wherein the FMR condition is established with each of the different microwave frequencies by sweeping the magnetic field from a minimum value to a maximum value.

33. The FMR measurement system of claim 1 wherein the FMR condition is established by holding the magnetic field constant and sweeping with a plurality of different microwave frequencies applied in a sequential order.

34. The FMR measurement system of claim 1 wherein the at least one RF generator comprises a plurality of "p" RF generators (where p is an integer $1 < p \leq m$) that are each configured to provide the sequence of different RF input signals.

35. A method of performing a ferromagnetic resonance (FMR) measurement at a plurality of "m" predetermined locations on a whole wafer under test (WUT) having one or more magnetic films or magnetic structures formed thereon, where "m" is an integer $\geq 2$, comprising:
providing a wafer chuck or stage on which the WUT is held, and having a first link to a controller;
providing a mounting plate on which a plurality of "m" RF probes are mounted and configured to contact "m" predetermined locations of the WUT, and providing lateral and vertical movements of the mounting plate or wafer chuck in a step and repeat fashion;
providing a device to deliver RF input signals in a form of different microwave frequencies from at least one RF generator to each of the plurality of "m" RF probes;
providing a signal pathway in each of the plurality of "m" RF probes enabling the transmission of the RF input signals to the WUT at each predetermined location of the WUT;
applying a magnetic field from a magnetic field source simultaneously with each different microwave frequency to establish a FMR condition at each predetermined location of the WUT thereby resulting in a RF output signal for each pair of an applied microwave frequency value and an applied magnetic field value;
transmitting the plurality of RF output signals to "n" RF diodes (where n is an integer $1 \leq n \leq m$), and wherein each RF diode collects the RF output signals from one or more RF probes when the FMR condition occurs at each of the predetermined locations; and
transmitting the output signals from the "n" RF diodes to a computer that manages the application of the different microwave frequencies and magnetic field, and converts the output signals to data comprised of one or more magnetic properties.

36. The method of claim 35 wherein the device that delivers the RF input signals from the at least one RF generator to each of the RF probes is a RF power distribution device that delivers the RF input signals to all the RF probes simultaneously.

37. The method of claim 35 wherein the device that delivers the RF input signals from the at least one RF generator to each of the RF probes is a RF power routing device that delivers the RF input signal to all RF probes consecutively.

38. The method of claim 35 wherein the device that delivers the RF input signals from the at least one RF generator to each of the RF probes is comprised of a combination of at least one RF power distribution device and at least one RF power routing device.

39. The method of claim 36 wherein the RF power distribution device is comprised of a broadband RF multi-port directional coupler.

40. The method of claim 36 wherein the RF power distribution device is configured with a plurality of "m" broadband RF directional couplers connected in series such that each of the broadband RF directional couplers transmits a RF signal to one of the "m" RF probes.

41. The method of claim 36 wherein the RF power distribution device is comprised of a broadband multi-port Wilkinson power divider.

42. The method of claim 41 wherein the Wilkinson power divider has a plurality of "m" output ports such that each output port transmits a RF signal to one of the "m" RF probes.

43. The method of claim 36 wherein the RF power distribution device has a plurality of "m" output ports such that each output port transmits a RF signal to one of the "m" RF probes.

44. The method of claim 36 wherein the RF power distribution device is comprised of a plurality of RF power distribution devices connected in series, or in a "tree-like" configuration, or both.

45. The method of claim 37 wherein the RF power routing device is comprised of an electromechanical RF switch, or a solid state RF switch with a multiplicity of outputs.

46. The method of claim 37 wherein the RF power routing device has a plurality of "m" output ports such that the RF signal is distributed to each of the "m" RF probes continuously.

47. The method of claim 37 wherein the RF power routing device is comprised of a plurality of electromechanical RF switches or solid state RF switches connected in series, or in a "tree-like" configuration, or both.

48. The method of claim 37 wherein the RF power routing device is comprised of a plurality of RF power routing devices connected in series, or in a "tree-like" configuration, or both.

49. The method of claim 37 wherein at least an additional RF power routing device is used to route the output signal of each RF probe to the "n" RF diodes.

50. The method of claim 35 that has a transmission mode configuration wherein the RF input signals from the at least one RF generator are transmitted through a first RF connector of each RF probe to the WUT through a first RF probe end or a first transmission line, and wherein the RF microwave signals emitted by the WUT are collected either by a second RF probe end or by the first transmission line of each RF probe, and wherein the RF output signals are then transmitted to one of the plurality of "n" RF diodes through a second RF connector.

51. The method of claim 35 that has a reflectance mode configuration wherein each RF probe is terminated by an open-circuit configuration, and wherein the RF input signals from the at least one RF generator are transmitted through an RF connector of each RF probe to the WUT through a first RF probe end or transmission line, and wherein the RF output signals from the WUT are collected by the first RF probe end or transmission line of each RF probe, and wherein the RF output signals are then transmitted to one of the plurality of "n" RF diodes through the RF input connector.

52. The method of claim 35 further comprised of a Data Acquisition (DAQ) system inserted between the plurality of "n" RF diodes and the computer.

53. The method of claim 35 wherein the magnetic field source has a plurality of "k" magnetic poles (where k is an integer 1≤k≤m), and wherein each magnetic pole is aligned above at least one of the "m" RF probes, such that the magnetic field is applied in a direction that is orthogonal to the WUT at each of the predetermined locations.

54. The method of claim 53 wherein the applied microwave frequency is in a range of 1 GHz to 100 GHz.

55. The method of claim 35 wherein the magnetic field source has a plurality of "2m" magnetic poles wherein two magnetic poles are positioned on opposite sides of each RF probe tip, and the magnetic field is applied in an in-plane direction at each of the one or more predetermined locations.

56. The method of claim 55 wherein the applied microwave frequency is in a range of 0.01 GHz to 100 GHz.

57. The method of claim 35 wherein the plurality of "m" RF probes and magnetic field source are installed in an electrical probe station.

58. The method of claim 35 wherein the plurality of "m" RF probes is attached to a probe card or mounting plate.

59. The method of claim 35 wherein the plurality of "m" RF probes is comprised of microstrips, striplines, coplanar waveguides, or grounded coplanar waveguides.

60. The method of claim 35 wherein the plurality of "m" RF probes is comprised of a form of printed circuit board transmission line, microcavities, coaxial waveguides, RF electrical probes, or a form of RF antenna.

61. The method of claim 35 wherein the magnetic field source comprises a multi-axis vector magnet, or a superconducting magnet.

62. The method of claim 35 wherein the magnetic field is up to 3 Tesla.

63. The method of claim 35 wherein each of the plurality of "m" RF probes contacts the one or more magnetic films or magnetic structures, or is within about 100 microns of the one or more magnetic films or magnetic structures.

64. The method of claim 35 wherein a RF amplifier (or multiple RF amplifiers) is included between the at least one RF generator and the device to deliver the RF input signals in order to compensate for the loss of power induced by the device to deliver the RF input signals from the at least one RF generator to each of the plurality of "m" RF probes.

65. The method of claim 35 wherein a low noise amplifier (or multiple low noise amplifiers) is used to enhance the RF output signal of at least one of the plurality of "n" RF diodes to improve FMR signal sensitivity.

66. The method of claim 35 wherein the FMR condition is established with each of the different microwave frequencies by sweeping the magnetic field from a minimum value to a maximum value.

67. The method of claim 35 wherein the FMR condition is established by holding the magnetic field constant and sweeping with a plurality of different microwave frequencies applied in a sequential order.

68. The method of claim 35 wherein the at least one RF generator comprises a plurality of "p" RF generators (where p is an integer 1<p≤m) that are each configured to provide a sequence of different RF input signals.

* * * * *